(12) United States Patent
Koizumi

(10) Patent No.: US 6,671,505 B1
(45) Date of Patent: Dec. 30, 2003

(54) FREQUENCY CONVERTER

(75) Inventor: Haruhiko Koizumi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/544,616

(22) Filed: Apr. 6, 2000

(30) Foreign Application Priority Data

Apr. 6, 1999 (JP) ............................................ 11-098564

(51) Int. Cl.[7] .................................................. H04B 1/38
(52) U.S. Cl. ........................ 455/333; 455/310; 455/317; 455/326
(58) Field of Search ................................ 455/310, 317, 455/323, 325, 326, 333; 327/113, 116, 355, 356

(56) References Cited

U.S. PATENT DOCUMENTS

| | | | |
|---|---|---|---|
| 3,716,730 A | * 2/1973 | Cerny | ........................ 307/295 |
| 5,465,419 A | 11/1995 | Zimmermann | |
| 5,678,226 A | 10/1997 | Li et al. | |

FOREIGN PATENT DOCUMENTS

| | | |
|---|---|---|
| JP | 63-310205 | 12/1988 |
| JP | 5-167352 | 7/1993 |
| JP | 5-206738 | 8/1993 |
| JP | 9-69731 | 3/1997 |
| JP | 10-335941 | 12/1998 |

* cited by examiner

*Primary Examiner*—Lee Nguyen
(74) *Attorney, Agent, or Firm*—Nixon & Peabody, LLP

(57) ABSTRACT

A frequency converter includes: a first terminal through which a local oscillator signal is input; a second terminal through which an input signal with a frequency to be converted is input; a third terminal through which an output signal with a different frequency resulting from the conversion is output; and a field effect transistor with gate, source and drain terminals for converting the frequency of the input signal and outputting the signal with the different frequency as the output signal. The gate terminal is connected to the first terminal, while the drain terminal is connected to the second and third terminals. The frequency converter further includes a trap circuit, which resonates at a frequency of a harmonic of the local oscillator signal to substantially eliminate the harmonic.

5 Claims, 3 Drawing Sheets

FREQUENCY CONVERTER

BACKGROUND OF THE INVENTION

The present invention relates to a frequency converter using a field effect transistor (FET).

A transceiver for use in mobile telecommunications sets or TV receivers needs a frequency converter. The frequency converter converts a radio frequency (RF) signal with a high frequency ranging from 1 to 20 GHz into an intermediate-frequency (IF) signal with a frequency ranging from 10 to 1,000 MHz, or vice versa, using a local oscillator (LO) signal.

To cope with recent upsurge in number of cellular phone users, demand for digital signal transmission and reception techniques has been steeply rising in the field of mobile telecommunications. Also, digital broadcasting has been rapidly popularized to meet the strong demand for multichannel satellite or ground wave telecasting. For these purposes, the distortion involved with a frequency converter should be reduced as much as possible using FET'S.

Frequency converters with an FET are classified into several types depending on the combination of LO, RF and IF signals with the three input terminals of the FET, namely, source, drain and gate terminals.

Among these various types, a type of frequency converter, in which the LO and RF signals are input to the gate and drain terminals of an FET and the IF signal is output through its drain terminal, is most preferable, because such a converter attains presently lowest possible distortion.

Hereinafter, a prior art frequency converter of this type will be described with reference to FIG. 6.

FIG. 6 illustrates a circuit configuration for the prior art frequency converter. As shown in FIG. 6, the gate terminal 1a of an FET 1 is connected to a first terminal 3, to which an LO signal is input, via an LO matching circuit 2. The drain terminal 1b of the FET 1 is connected to not only a second terminal 5 through an RF matching circuit 4 but also a third terminal 7 by way of an IF matching circuit 6. And the source terminal 1c of the FET 1 is grounded. The impedances of the LO, RF and IF matching circuits 2, 4 and 7 have been optimized in accordance with the frequencies of their associated LO, RF and IF signals, respectively.

Suppose this frequency converter is applied to downconversion, version, i.e., to convert a signal with a relatively high frequency into a signal with a relatively low frequency. In that case, the RF signal, which has been input to the second terminal 5, is converted into the IF signal using the LO signal that has been input through the first terminal 3, and then output through the third terminal 7. Conversely, suppose this frequency converter is applied to upconversion, i.e., to convert a signal with a relatively low frequency into a signal with a relatively high frequency. In that case, the IF signal, which has been input to the third terminal 7, is converted into the RF signal using the LO signal that has been S input through the first terminal 3, and then output through the second terminal 5.

Next, it will be described how the conventional frequency converter operates as a downconverter.

First, an LO signal with an alternating voltage, which has been input through the first terminal 3, is passed through the LO matching circuit 2 and then input to the gate terminal 1a of the FET 1. The FET 1 serves as a switch, which turns ON when the LO signal is positive and turns OFF when the LO signal is negative. Also, there is a channel resistor $R_{ds}$ (not shown) inside the FET 1. The channel resistor $R_{ds}$ functions as a nonlinear resistor having a resistance changing nonlinearly with time. Accordingly, when a relatively high alternating voltage (i.e., the LO signal) is applied to the gate terminal 1a of the FET 1, the RF signal, which has been input to the drain terminal 1b of the FET 1, is converted into the IF signal due to the existence of the nonlinear channel resistor $R_{ds}$. Then, the IF signal is output through the third terminal 7. Suppose the frequencies of the RF, LO and IF signals are represented as $f_{RF}$, $f_{LO}$ and $f_{IF}$, respectively. Since $f_{IF}$, represents a difference between $f_{RF}$, and $f_{LO}$, $f_{IF}=|f_{RF}-f_{LO}|$.

On the other hand, when the frequency converter functions as an upconverter, the IF signal input through the third terminal 7 is converted into the RF signal with a frequency represented as the sum of the frequencies $f_{IF}$ and $f_{LO}$ of the IF and LO signals; $|f_{IF}+f_{LO}|=f_{RF}$. Then, the RF signal is output through the second terminal 5.

The prior art frequency converter, however, has various shortcomings. Firstly, the frequency conversion performed by the converter is affected by the nonlinear channel resistor $R_{ds}$ to generate second and third harmonics with twice and thrice the frequencies of the fundamental frequency $f_{LO}$ of the LO signal, thus interfering with the frequency conversion by the FET 1.

Accordingly, when the frequencies of the LO, RF and IF signals are 2.2 GHz, 2.0 GHz and 200 MHz, respectively, the conventional frequency converter results in a conversion loss as high as about 7 dB.

Secondly, an LO signal amplifier including another FET usually precedes the first terminal 3 in a telecommunications system and those second and third harmonics are also generated during amplification by the LO signal amplifier. And those harmonics are input to the FET 1, too.

That is to say, the FET 1 is further affected by the additional harmonica produced by the FET on the previous stage. Accordingly, when the frequencies of the LO, RF and IF signals are 2.2 GHz, 2.0 GHz and 200 MHz, respectively, the conversion version loss involved with the conventional frequency conversion is as high as about 8 dB.

SUMMARY OF THE INVENTION

It is therefore an object of the present invention to reduce a conversion loss caused by a frequency converter.

A first inventive frequency converter includes: a first terminal through Which a local oscillator signal is input; a second terminal through which an input signal with a frequency to be converted is input; a third terminal through which an output signal with a different frequency resulting from the conversion is output; and a field effect transistor with gate, source and drain terminals for converting the frequency of the input signal and outputting the signal with the different frequency as the output signal. The gate terminal is connected to the first terminal, while the drain terminal is connected to the second and third terminals. The frequency converter further includes a trap circuit, which is connected to the source terminal of the field effect transistor and resonates at a frequency of a harmonic of the local oscillator signal, thereby substantially eliminating the harmonic.

In the first frequency converter, the trap circuit resonates at a frequency of a harmonic of the local oscillator signal, thereby substantially eliminating the harmonic. That is to say, the frequency conversion by the field effect transistor is much less interfered with by the harmonic, thus attaining reduced conversion loss and improved conversion efficiency. Accordingly, supposing the first inventive frequency converter results in a conversion loss at the same level as the prior art converter, the inventive converter can greatly reduce the power level of the LO signal. As a result, this converter can greatly contribute to reduction in power dissipated by a wireless communications system.

In one embodiment of the present invention, the trap circuit preferably includes: an LC serial circuit consisting of an inductor and a capacitor that are connected in series to each other; and a resistor connected in parallel to the LC serial circuit. In the trap circuit, $f=1/(2\pi \times (LC)^{1/2})$ is preferably met, where f is the frequency of the harmonic of the local oscillator signal, L is an inductance of the inductor and C is a capacitance of the capacitor. And one terminal of the trap circuit is preferably connected to the source terminal of the field effect transistor, while the other terminal of the trap circuit is preferably grounded.

In such an embodiment, the trap circuit resonates at a frequency of a second harmonic of the local oscillator signal. Accordingly, the frequency conversion performed by the field effect transistor is much less interfered with by the second harmonic.

A second inventive frequency converter includes: a first terminal through which a local oscillator signal is input; a second terminal through which an input signal with a frequency to be converted is input; a third terminal through which an output signal with a different frequency resulting from the conversion is output; and a field effect transistor with gate, source and drain terminals for converting the frequency of the input signal and outputting the signal with the different frequency as the output signal. The gate terminal is connected to the first terminal, while the drain terminal is connected to the second and third terminals. The converter further includes a trap circuit, which is connected to the gate terminal of the field effect transistor and resonates at a frequency of a harmonic of the local oscillator signal, thereby substantially eliminating the harmonic.

In the second frequency converter, the trap circuit resonates at a frequency of a harmonic of the local oscillator signal, thereby substantially eliminating the harmonic. That is to say, the frequency conversion performed by the field effect transistor is much less interfered with by the harmonic. In addition, the amplification performed by another field effect transistor, which is provided at a stage preceding the first terminal for amplifying the LO signal, is also much less interfered with by the harmonic, thus attaining far lower conversion loss and much higher conversion efficiency. Accordingly, supposing the second inventive frequency converter results in a conversion loss at the same level as the prior art converter, the inventive converter can greatly reduce the power level of the LO signal. As a result, this converter significantly contributes to further reduction in power dissipated by a wireless communications system.

In one embodiment of the present invention, the trap circuit preferably includes an LC serial circuit consisting of an inductor and a capacitor that are connected in series to each other. In the trap circuit, $f=1/(2\pi \times (LC)^{1/2}$ is preferably met, where f is the frequency of the harmonic of the local oscillator signal, L is an inductance of the inductor and C is a capacitance of the capacitor. And one terminal of the trap circuit is preferably connected to the gate terminal of the field effect transistor, while the other terminal of the trap circuit is preferably grounded.

In such an embodiment, the trap circuit resonates at a frequency of a second harmonic of the local oscillator signal. Thus, both the frequency conversion by the field effect transistor and the amplification by another field effect transistor are much less interfered with by the second harmonic.

In an alternative embodiment, the trap circuit may includes an LC parallel circuit consisting of an inductor and a capacitor that are connected in parallel to each other. In the trap circuit, $f=1/(2\pi \times (LC)^{1/2})$ is also preferably met, where f is the frequency of the harmonic of the local oscillator signal, L is an inductance of the inductor and C is a capacitance of the capacitor. And one terminal of the trap circuit is preferably connected to the gate terminal of the field effect transistor, while the other terminal of the trap circuit is preferably connected to the first terminal.

In such an embodiment, the trap circuit resonates at a frequency of a second harmonic of the local oscillator signal. Thus, both the frequency conversion by the field effect transistor and the amplification by another field effect transistor are much less interfered with by the second harmonic.

DESCRIPTION OF THE PREFERRED EMBODIMENTS

EMBODIMENT 1

Hereinafter, a frequency converter according to a first embodiment of the present invention will be described with reference to FIGS. 1 and 2.

Figure 1:
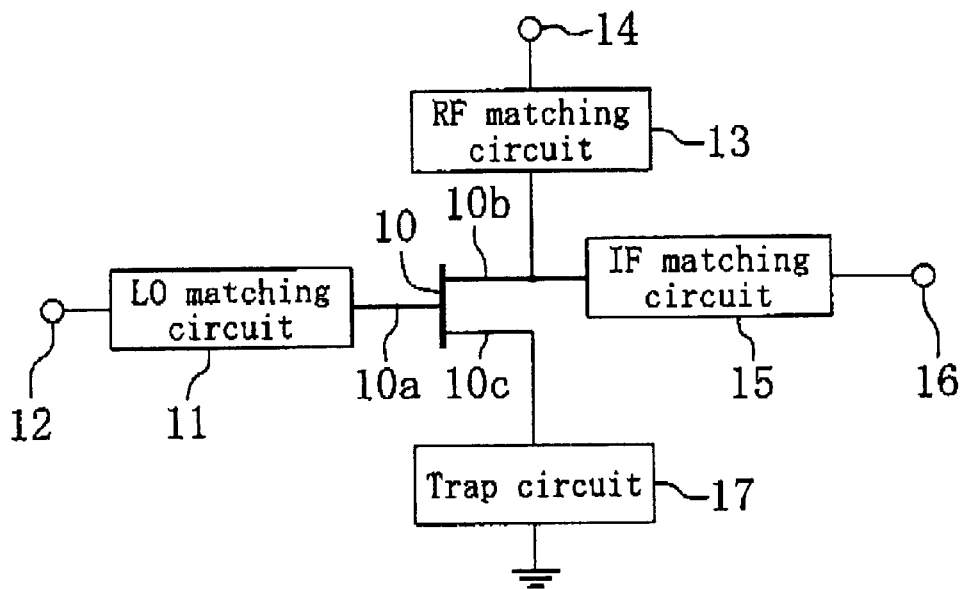
FIG. 1 is a circuit diagram schematically illustrating a frequency converter according to a first embodiment of the present invention.

FIG. 1 illustrates a schematic circuit configuration for the frequency converter according to the first embodiment. As shown in FIG. 1, the gate terminal 10a of an FET 10 is connected to a first terminal 12, to which an LO signal is input, via an LO matching circuit 11. The drain terminal 10b of the FET 10 is connected to not only a second terminal 14 through an RP matching circuit 13 but also a third terminal 16 by way of an IF matching circuit 15.

The frequency converter according to the first embodiment is characterized by grounding the source terminal 10c of the FET 10 via a trap circuit 17. The trap circuit resonates at respective frequencies of the second and third harmonics of the LO signal, thereby substantially eliminating these harmonic components. The impedances of the LO, RF and IF matching circuits 11, 13 and 15 have been optimized in accordance with the frequencies of their associated LO, RF and IF signals, respectively.

Suppose the frequency converter of the first embodiment is applied to downconversion, to convert a signal with a relatively high frequency into a signal with a relatively low frequency. In that case, the RF signal, which has been input to the second terminal 14, is converted into the IF signal using the LO signal that has been input through the first terminal 12, and then output through the third terminal 16. Conversely, suppose this frequency converter is applied to upconversion, i.e., to convert a signal with a relatively low frequency into a signal with a relatively high frequency. In that case, the IF signal, which has been input to the third terminal 16, is converted into the RP signal using the LO signal that has been input through the first terminal 12, and then output through the second terminal 14.

Next, it will be described how the frequency converter of the first embodiment operates as a downconverter.

When the RF signal with a frequency $f_{RF}$ is input through the second terminal 14 to the drain terminal 10b of the FET 10, the frequency $f_{RF}$ of the RF signal is reduced by the frequency $f_{LO}$ of the LO signal, which has been input through the first terminal 12, due to the existence of a nonlinear channel resistor $R_d$ in the FET 10. Thus, the RF signal is converted into the IF signal with a frequency $f_{IF}(=|f_{RF}-f_{LO}|)$, which is output through the third terminal 16.

In this case, the second and third harmonics of the LO signal, which have been produced due to the existence of the channel resistor $R_d$ in the FET, are substantially eliminated by the tap circuit 17. That is to say, the frequency conversion performed by the FET 10 is much less interfered with by the harmonics. As a result, this frequency converter attains lower conversion loss and higher conversion efficiency.

For example, suppose the frequencies of the LO, RF and IF signals are 2.2 GHz, 2.0 GHz and 200 MHz, respectively, and the trap circuit 17 substantially eliminates the second and third harmonics. In that case, the conversion loss involved with the frequency converter is about 4 dB, which is about 3 dB lower than that involved with the prior art frequency converter.

Figure 2:
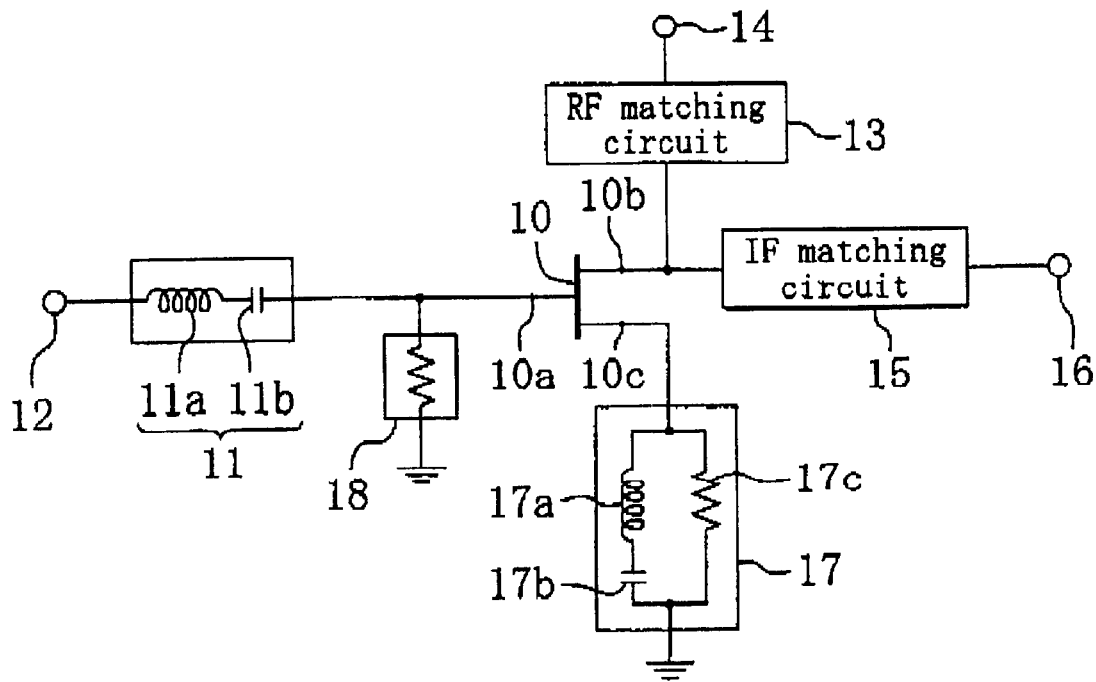
FIG. 2 is a circuit diagram illustrating a specific implementation of the frequency converter according to the first embodiment.

FIG. 2 illustrates a specific implementation of the frequency converter according to the first embodiment. As shown in FIG. 2, the LO matching circuit 11 is an LC serial circuit consisting of an inductor 11a and a capacitor 11b that are connected in series to each other. A bias circuit 18 is provided between the LO matching circuit 11 and the FET 10. One terminal of the bias circuit 18 is grounded via a resistor, while the other terminal thereof is connected to the gate terminal 10a of the FET 10 to apply a bias voltage thereto. It should be noted that the LO matching circuit 11 and bias circuit 18 may have any configurations other than those illustrated in FIG. 2.

The trap circuit 17 is implemented as an LC resonator, which includes: an LC serial circuit consisting of an inductor 17a and a capacitor 17b that are connected in series to each other; and a resistor 17c connected in parallel to the LC serial circuit. One terminal of the LC resonator 17 is connected to the source terminal 10c of the FET 10, while the other terminal thereof is grounded.

Suppose a resonant frequency condition given by $f=1/(2\pi \times (LC)^{1/2})$ is met, where f is the frequency of the harmonic of the LO signal, L is an inductance of the inductor 17a and C is a capacitance of the capacitor 17b. In that case, the trap circuit 17 resonates at a frequency of the second harmonic of the LO signal. Thus, the second harmonic component of the LO signal can be eliminated. Specifically, where the frequency of the LO signal is 2.2 GHz, the second harmonic component of the LO signal can be removed by setting the inductance L of the inductor 17a and capacitance C of the capacitor 17b to 1.3 nH and 1 pF, respectively.

In this manner, the trap circuit 17 can eliminate the second harmonic component of the LO signal with much more certainty. As a result, the conversion loss involved with this frequency converter is about 4.5 dB, which is about 2.5 dB lower than that of the prior art frequency converter.

EMBODIMENT 2

Next, a frequency converter according to a second embodiment of the present invention will be described with reference to FIGS. 3, 4 and 5.

Figure 3:
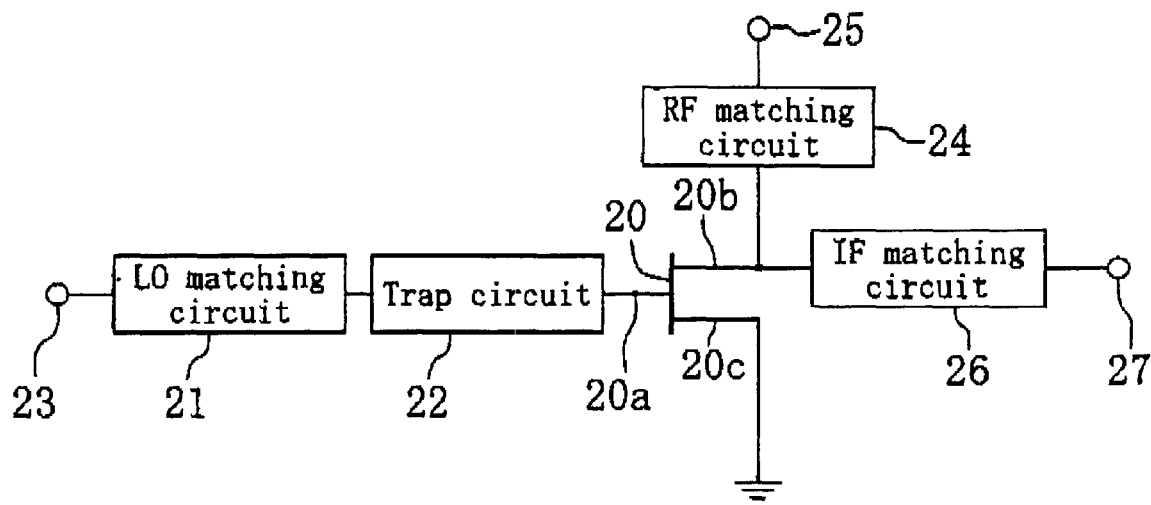
FIG. 3 is a circuit diagram schematically illustrating a frequency converter according to a second embodiment of the present invention.

FIG. 3 illustrates a circuit configuration for the frequency converter according to the second embodiment. As shown in FIG. 3, the gate terminal 20a of an FET 20 is connected to a first terminal 23, to which an LO signal is input, via an LO matching circuit 21 and a trap circuit 22. The drain terminal 20b of the FET 20 is connected to not only a second terminal 25 through an RF matching circuit 24 but also a third terminal 27 by way of an IF matching circuit 26. The impedances of the LO, RF and IF matching circuits 21, 24 and 26 have been optimized in accordance with the frequencies of their associated LO, RF and IF signals, respectively. In the example illustrated in FIG. 3, the LO matching circuit 21 precedes the trap circuit 22. Alternatively, the trap circuit 22 may precede the LO matching circuit 21.

The trap circuit 22 resonates at respective frequencies of the second and third harmonics of the LO signal to substantially eliminate these harmonics. Thus, the second and third harmonics of the LO signal, which have been produced due to the existence of a channel resistor $R_d$ in the FET 20, are substantially removed by the tap circuit 22. That is to say, the frequency conversion performed by the FET 20 is much less interfered with by the harmonics.

In addition, according to the second embodiment, the trap circuit 22 is connected to the gate terminal 20a of the FET 20. Accordingly, even if a second FET is connected as a preceding-stage amplifier to the first terminal 23 to amplify the LO signal and if second and third harmonics of the LO signal are produced during the amplification by the second FET, these harmonics are also removable by the trap circuit 22. That is to say, the trap circuit 22 according to the second embodiment can eliminate not only the harmonics produced in the FET 20 but also those produced in the second FET functioning as an amplifier. As a result, the conversion loss involved with this frequency converter can be greatly reduced and the conversion efficiency can be considerably increased.

For example, suppose the frequencies of the LO, RF and IF signals are 2.2 GHz, 2.0 GHz and 200 MHz, respectively, and the trap circuit 22 substantially eliminates the second and third harmonics. In that case, the conversion loss involved with this frequency converter is about 4.5 dB, which is about 3.5 dB lower than that involved with the conventional frequency converter including an amplifier on a stage preceding the first terminal.

Figure 4:
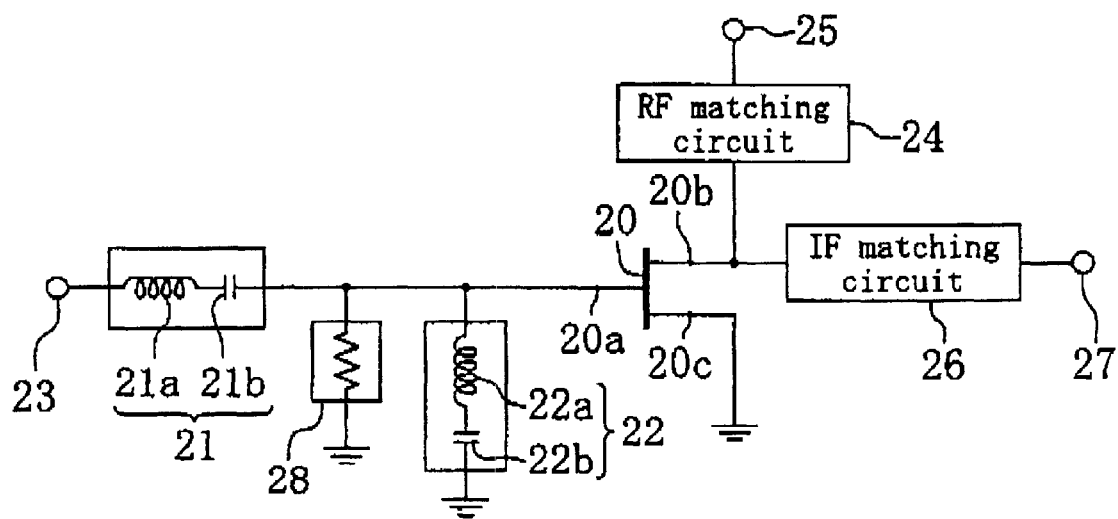
FIG. 4 is a circuit diagram illustrating a specific implementation of the frequency converter according to the second embodiment.

FIG. 4 illustrates a specific implementation of the frequency converter according to the Second embodiment. As shown in FIG. 4, the LO matching circuit 21 is an LC serial circuit consisting of an inductor 21a and a capacitor 21b that are connected in series to each other. A bias circuit 28 is provided between the LO matching circuit 21 and the FET 20. One terminal of the bias circuit 28 is grounded via a resistor, while the other terminal thereof is connected to the gate terminal 20a of the FET 20 by way of the trap circuit 22 to apply a bias voltage to the FET 20. It should be noted that the LO matching circuit 21 and bias circuit 28 may have any configurations other than those illustrated in FIG. 4.

The trap circuit 22 is implemented as an LC resonator, in which an inductor 22a and a capacitor 22b are connected in series to each other. One terminal of the LC resonator 22 is connected to the gate terminal 20a of the FET 20, while the other terminal thereof is grounded.

Suppose a resonant frequency condition given by $f=1/(2\pi \times (LC)^{1/2})$ is met, where f is the frequency of the harmonic of the LO signal, L is an inductance of the inductor 22a and C is a capacitance of the capacitor 22b. In that case, the trap circuit 22 resonates at a frequency of the second harmonic of the LO signal. Thus, the second harmonic component of the LO signal can be eliminated. Specifically, where the frequency of the LO signal is 2.2 GHz, the second harmonic component of the LO signal is removable by setting the inductance L of the inductor 22a and capacitance C of the capacitor 22b to 1.3 nH and 1 pF, respectively.

In this manner, the trap circuit 22 can eliminate the second harmonic component of the LO signal with much more certainty. As a result, the conversion loss involved with this frequency converter is about 5 dB, which is about 3 dB lower than that of the conventional frequency converter including an amplifier at a stage preceding the first terminal.

Figure 5:
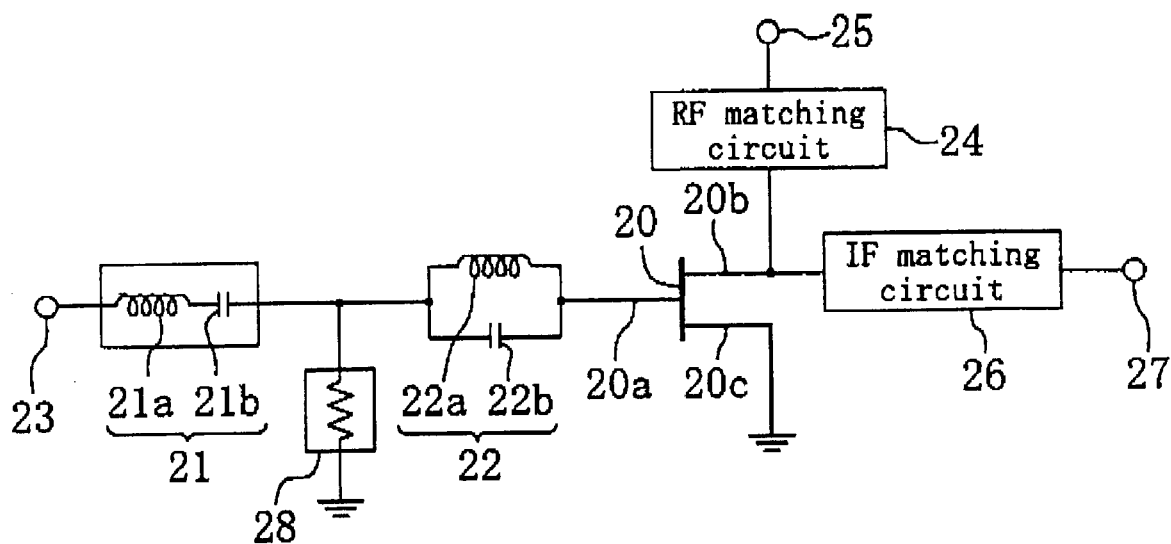
FIG. 5 is a circuit diagram illustrating another specific implementation of the frequency converter according to the second embodiment.
Figure 6:
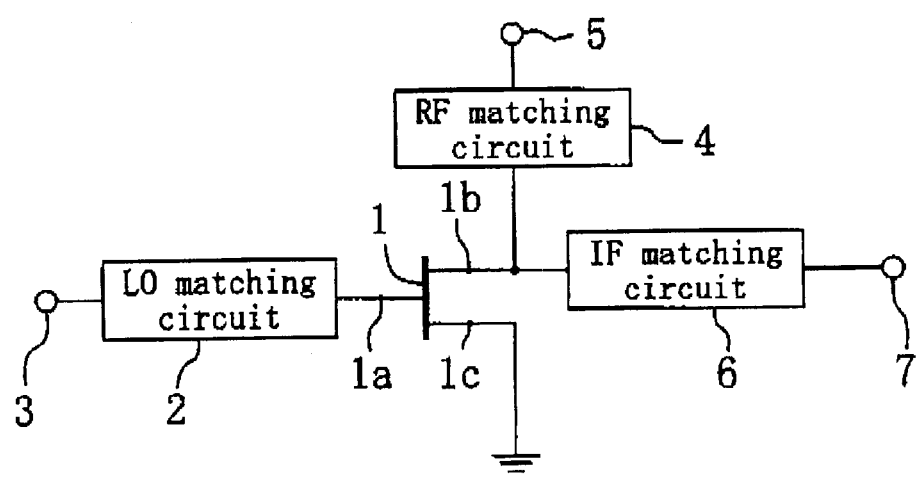
FIG. 6 is a circuit diagram schematically illustrating a prior art frequency converter.

FIG. 5 illustrates another specific implementation of the frequency converter according to the second embodiment. As shown in FIG. 5, the LO matching circuit 21 is an LC serial circuit consisting of an inductor 21a and a capacitor 21b that are connected in series to each other. A bias circuit 28 is provided between the LO matching circuit 21 and the FET 20. One terminal of the bias circuit 28 is grounded via a resistor, while the other terminal thereof is connected to the gate terminal 20a of the FET 20 by way of a trap circuit 22 to apply a bias voltage to the FET 20. It should be noted that the LO matching circuit 21 and bias circuit 28 may have any configurations other than those illustrated in FIG. 5.

The trap circuit 22 is implemented as an LC resonator, in which an inductor 22a and a capacitor 22b are connected in parallel to each other. One terminal of the LC resonator 22 is connected to the gate terminal 20a of the FET 20, while the other terminal thereof is connected to the first terminal 23 via the Lo matching circuit 21.

Suppose a resonant frequency condition given by $f=1/(2\pi \times (LC)^{1/2})$ is met, where f is the frequency of the harmonic of the LO signal, L is an inductance of the inductor 22a and C is a capacitance of the capacitor 22b. In that case, the trap circuit 22 resonates at a frequency of the second harmonic of the LO signal. Thus, the second harmonic component of the LO signal can be eliminated. Specifically, where the frequency of the LO signal is 2.2 GHz, the second harmonic component of the LO signal is removable by setting the inductance L of the inductor 22a and capacitance C of the capacitor 22b to 1.3 nH and 1 pF, respectively.

In this manner, the trap circuit 22 can eliminate the second harmonic component of the LO signal with much more certainty. AS a result, the conversion loss involved with this frequency converter is about 5 dB, which is about 3 dB lower than that of the conventional frequency converter including an amplifier at a stage preceding the first terminal.

What is claimed is:

1. A frequency converter comprising:
   a first terminal through which a local oscillator signal is input;
   a second terminal through which an input signal with a frequency to be converted is input;
   a third terminal through which an output signal with a different frequency resulting from the conversion is output;
   a field effect transistor with gate, source and drain terminals for converting the frequency of the input signal and outputting the signal with the different frequency as the output signal, the gate terminal being connected to the first terminal, the drain terminal being connected to the second and third terminals; and
   a trap circuit, which is connected to the source terminal of the field effect transistor and resonates at a frequency of a harmonic of the local oscillator signal, thereby substantially eliminating the harmonic.

2. The converter of claim 1, wherein the trap circuit comprises:
   an LC serial circuit including an inductor and a capacitor that are connected in series to each other; and
   a resistor connected in parallel to the LC serial circuit, and
   wherein $f=1/(2\pi \times (LC)^{1/2})$ is met, where f is the frequency of the harmonic of the local oscillator signal, L is an inductance of the inductor and C is a capacitance of the capacitor, and
   wherein one terminal of the trap circuit is connected to the source terminal of the field effect transistor, while the other terminal of the trap circuit is grounded.

3. A frequency converter comprising:
   a first terminal through which a local oscillator signal is input;
   a second terminal through which an input signal with a frequency to be converted is input;
   a third terminal through which an output signal with a different frequency resulting from the conversion is output;
   a field effect transistor with gate, source and drain terminals for converting the frequency of the input signal and outputting the signal with the different frequency as the output signal, the gate terminal being connected to the first terminal, the drain terminal being connected to the second and third terminals; and
   a trap circuit, which is connected to the gate terminal of the field effect transistor and resonates at a frequency of a second or third harmonic of the local oscillator signal, thereby substantially eliminating the harmonic.

4. The converter of claim 3, wherein the trap circuit comprises an LC serial circuit including an inductor and a capacitor that are connected in series to each other, and
   wherein $f=1/(2\pi \times (LC)^{1/2})$ is met, where f is the frequency of the harmonic of the local oscillator signal, L is an inductance of the inductor and C is a capacitance of the capacitor, and
   wherein one terminal of the trap circuit is connected to the gate terminal of the field effect transistor, while the other terminal of the trap circuit is grounded.

5. The converter of claim 3, wherein the trap circuit comprises an LC parallel circuit including an inductor and a capacitor that are connected in parallel to each other, and
   wherein $f=1/(2\pi \times (LC)^{1/2})$ is met, where f is the frequency of the harmonic of the local oscillator signal, L is an inductance of the inductor and C is a capacitance of the capacitor, and
   wherein one terminal of the trap circuit is connected to the gate terminal of the field effect transistor, while the other terminal of the trap circuit is connected to the first terminal.

* * * * *